United States Patent [19]

Sedrick, Jr. et al.

[11] Patent Number: 4,679,720
[45] Date of Patent: Jul. 14, 1987

[54] MASS SOLDERING SYSTEM PROVIDING A SWEEPING FLUID BLAST

[75] Inventors: A. Victor Sedrick, Jr., Goffstown, N.H.; Charles R. Lowell, Concord, Mass.

[73] Assignee: Hollis Automation, Inc., Nashua, N.H.

[21] Appl. No.: 922,184

[22] Filed: Oct. 23, 1986

[51] Int. Cl.⁴ ............................................. H05K 3/34
[52] U.S. Cl. ........................................ 228/20; 228/37; 118/63
[58] Field of Search ..................... 118/63; 228/20, 37, 228/46, 180.1, 180.2

[56] References Cited

U.S. PATENT DOCUMENTS

| | | | |
|---|---|---|---|
| 3,500,536 | 3/1970 | Goldschmied | 228/20 |
| 3,865,298 | 2/1975 | Allen et al. | 228/20 |
| 4,401,253 | 8/1983 | O'Rourke | 228/37 |

FOREIGN PATENT DOCUMENTS 912424   3/1982   U.S.S.R. ............................... 228/20

Primary Examiner—Nicholas P. Godici
Assistant Examiner—Samuel M. Heinrich
Attorney, Agent, or Firm—Hayes, Davis & Soloway

[57] ABSTRACT

A soldering system is described in which a fluid stream is directed onto a solder board substantially immediately following the deposition of molten solder onto the boards. The apparatus includes a pair of concentric slotted tubular shells wherein one shell rapidly rotates relative to about the other to create a plurality of different angles of impingement of the air on each area of the bottom surface of the circuit board.

14 Claims, 9 Drawing Figures

MASS SOLDERING SYSTEM PROVIDING A SWEEPING FLUID BLAST

BACKGROUND OF THE INVENTION

The present invention is directed to an improvement in a mass soldering system of the type described in the earlier patents of H. T. O'Rourke, U.S. Pat. Nos. 4,410,126 and 4,401,253. This prior patented system involves directing a hot air knife blast onto the bottom surface of a printed component-carrying circuit board, the air blast impinging on the surface immediately after the printed circuit board leaves a wave soldering system. The impinging air blast is reported to reduce the incidence of solder shorts, icicling and/or bridging, and has achieved widespread adoption.

In working with the previously patented system of O'Rourke, it has been found that with certain types of components, different angles of air blast give optimum solder removal to prevent solder shorts, icicling and/or bridging.

BRIEF SUMMARY OF THE INVENTION

In commonly owned copending U.S. patent application Ser. No. 890,415, filed July 25, 1986, there is described an improvement in the mass soldering system of the type described in the above mentioned patents of O'Rourke in which there is provided a pulsating or a sweeping air blast at a plurality of different angles of impingement of the air on each area of the bottom surface of the circuit board as it leaves the solder wave. As a result of the provision of a pulsating or a sweeping air blast, each area of the circuit board is subjected to hot air blasts coming from a plurality of different angles so that, no matter what type of circuit element is connected to the board at any particular point, it will, at some time during the pulsating or sweeping motion of the air blast, be subjected to that angle which is optimum for removal of the solder constituting potential solder shorts, icicles and/or bridges. The present invention provides an improved mechanism and mass for achieving a continuously sweeping air blast.

DETAILED DESCRIPTION OF THE INVENTION

In order to more fully understand the invention, reference should be had to the following detailed description of a preferred form of the invention, this description being largely based on the previously patented invention described in U.S. Pat. No. 4,410,126, the disclosure of which is embodied herein in its entirety. For a fuller understanding of the objects of the present invention, reference should be had to the following detailed description taken in connection with the accompanying drawing in which like numerals depict like parts, and:

In the following detailed description of the present invention, various terms such as components, leads, solder, etc., shall have the same meaning as described in more detail in the above mentioned U.S. Pat. Nos. 4,410,126 and 4,401,253 of O'Rourke.

Figure 1:
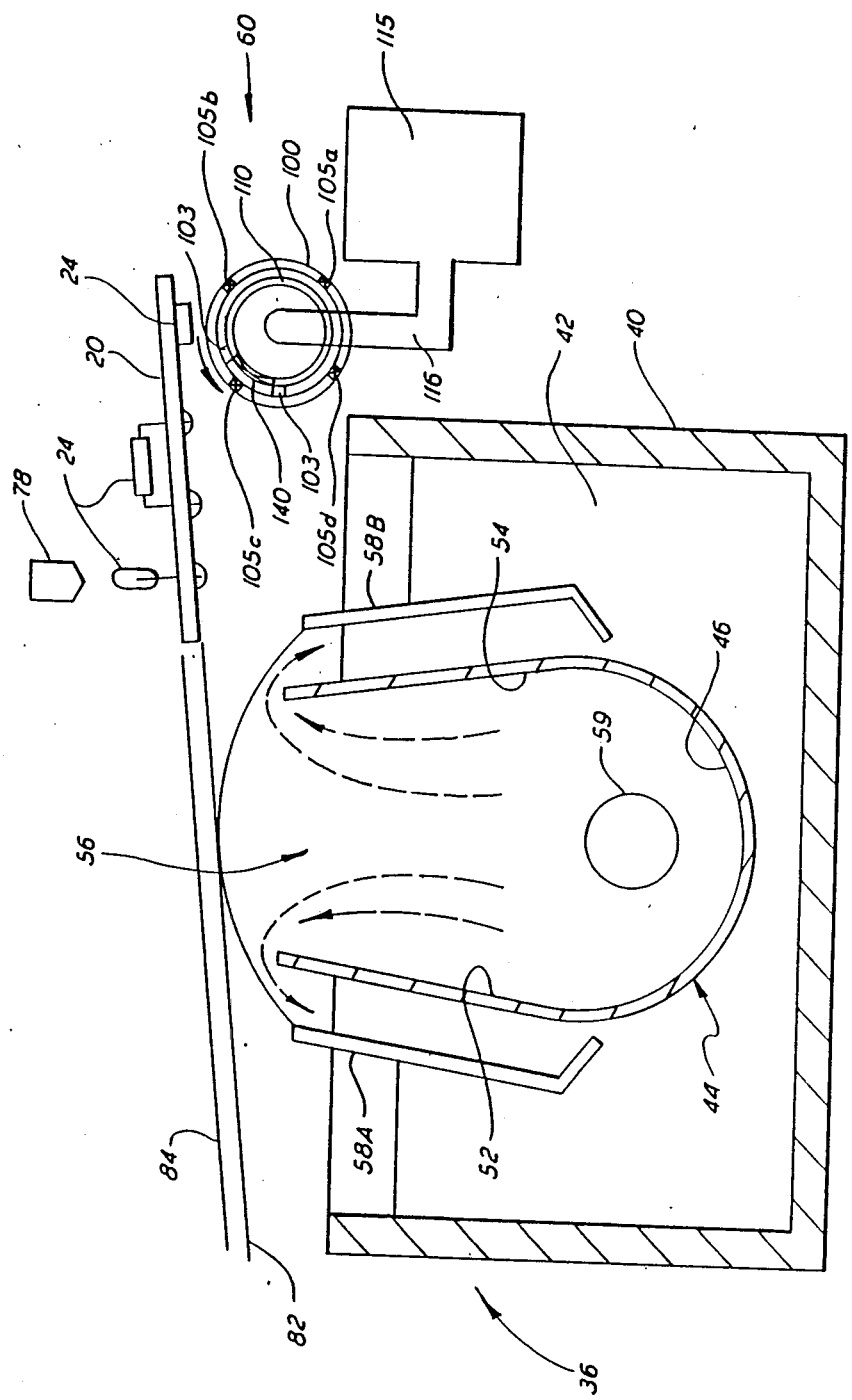
FIG. 1 is a side elevational view partly in section of one form of soldering apparatus made in accordance with the present invention and which provides a sweeping air blast of continuously varying impingement angle to the underside of a circuit board as it leaves the wave solder.
Figure 2:
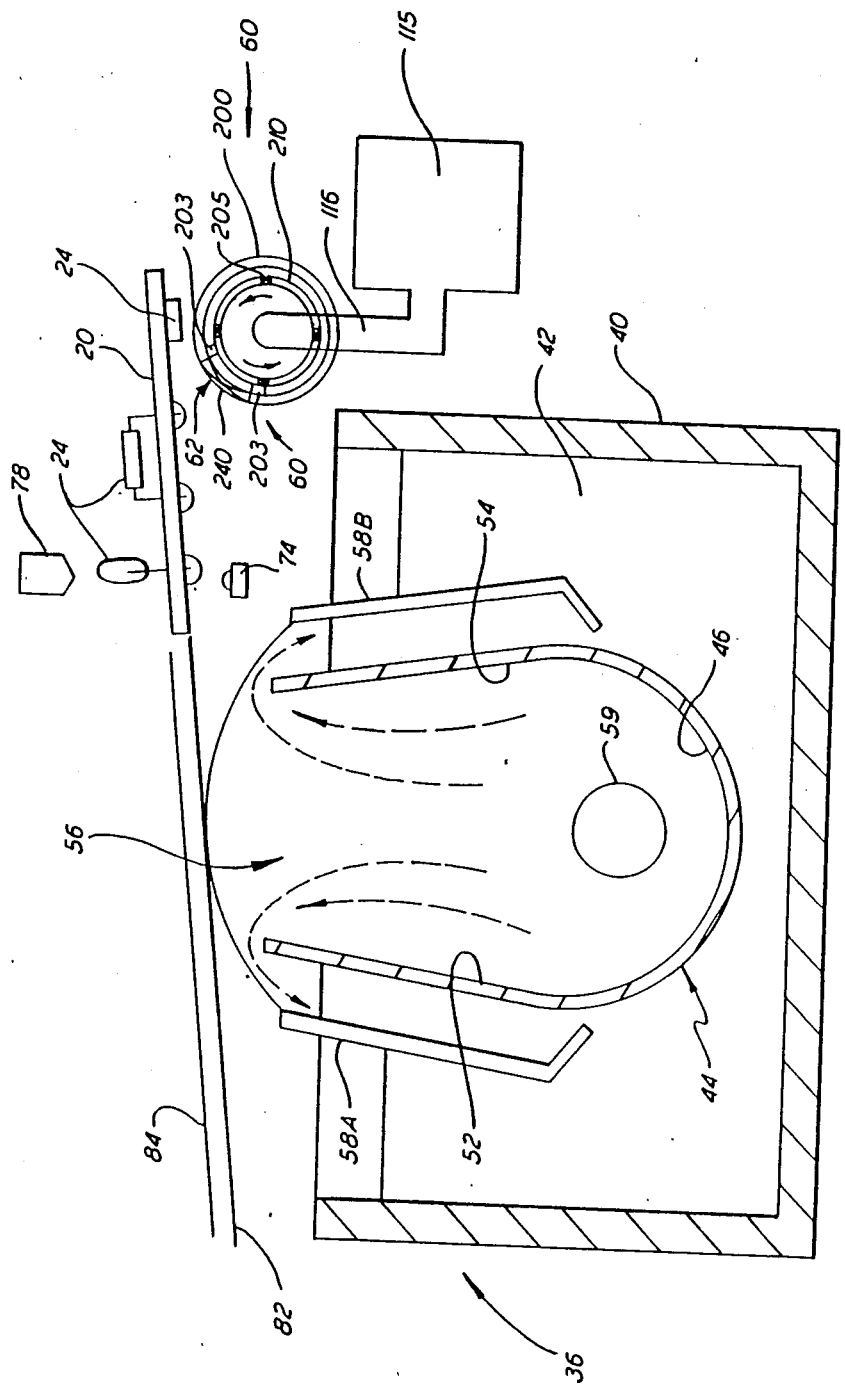
FIG. 2 is a side elevational view partly in section of a soldering apparatus showing a second embodiment of the invention and providing a sweeping air blast of continuously varying impingement angle to the underside of a circuit board as it leaves the solder wave.

For convenience, FIGS. 1, 2 and 5 through 8 in the present invention are illustrated as a modification of FIG. 2 of the above mentioned U.S. Pat. No. 4,410,126, and reference numerals employed in the present drawing are the same as those used in FIG. 2 of the earlier U.S. Pat. No. 4,410,126.

Figure 3:
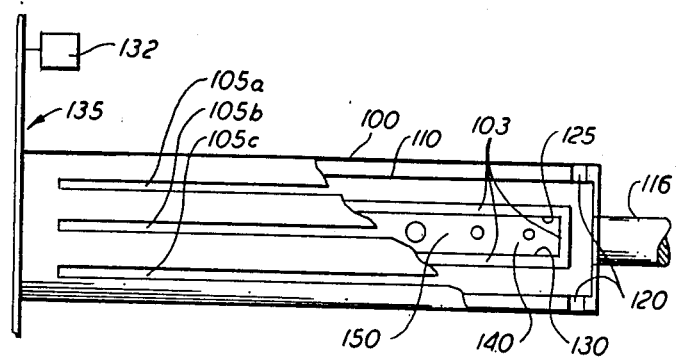
FIG. 3 is a top plan view partly in section of the sweeping air blast portion of the apparatus of FIG. 1.

Referring to FIGS. 1 and 3 of the drawings, the printed circuit board, after passing through standard fluxing and preheating stations, is passed through a mass wave soldering station 36. The components 24 may be mounted on the upper surface of the board with leads protruding downwardly through holes in the board and/or may be secured to the bottom surface of the board (such as by means of an adhesive) with the leads protruding therefrom to contact lands on the board. In both cases the mass soldering station completes the electrical and mechanical connections of the component leads to the board. The mass wave soldering station includes a container of conventional design indicated generally at 40 for holding a supply of molten solder 42. Conventional heating means (not shown) may be secured to the bottom and/or side walls of container 40 or immersed in the solder to heat and maintain the supply of solder 42 in molten condition.

A sump and nozzle assembly indicated generally at 44 is disposed interiorly of container 40. The sump and nozzle assembly 44 is of conventional design and typically comprises a rounded bottom wall 46, a pair of substantially vertically opposed end walls (not shown) and a pair of inclined side walls 52 and 54. The upper ends of end walls and side walls 52 and 54 are spaced from one another to form a narrow elongated rectangular nozzle or slot 56 which extends above the molten solder level in container 40 for a suitable distance, e.g. one inch above the molten solder level.

Preferably, the sump also includes a pair of adjustable sluice plates 58A, 58B spaced from the sump side walls 52 and 54 for controlling solder overflow from the nozzle 56, e.g. in accordance with the teachings of U.S. Pat. No. 3,398,873 to Kenneth G. Boynton and Howard W. Wegener. Completing the soldering station is a variable speed pump (not shown) which communicates through an intake orifice 59 in the lower end of sump and nozzle assembly 44 for pumping solder into the sump where it then rises and overflows the nozzle 56 as a standing solder wave.

An important feature and critical requirement of the present invention is the ability to relocate excess solder on, and/or remove excess solder from the bottom of the circuit board, and from any interconnections, component leads and/or component bodies carried thereon, before the solder can solidify as shorts, icicles and/or bridges. This is accomplished by treating the soldered circuit board and depending component leads at an excess solder removal station 60. Excess solder removal station 60 follows soldering station 36 immediately in-line and is designed to relocate or blow off excess solder from the board underside before the solder solidifies as shorts, icicles and/or bridges. Solder removal station 60 comprises one or more fluid jets, fluid knives, slots, nozzles or the like and the apparatus is indicated generally at 62, from which a heated fluid stream, e.g. hot air, can be directed onto the underside of the board 20. Fluid flow rate, fluid pressure, and fluid temperature and the time elapsed between circuit board emersion from the solder wave and beginning of contact by the fluid stream may vary widely depending on the board temperature, ambient temperature, melting point of the solder, specific heat of fluid and heat transfer coefficient of fluid to the board, board size and shape, component density, amount of solder deposited and to be removed, conveyor speed, and distance between the soldering station and the excess solder removal station. Preferably apparatus 62 is disposed proximate the path of travel of the boards. Apparatus 62 of course must be spaced sufficiently below the path of travel of the boards to permit clearance of the longest depending lead, etc. Inert gas may be used as the fluid, but preferably the impinging fluid comprises air. The fluid should be preheated to a temperature above that of the molten solder in the soldering station (which for standard 63:37 solder is approximately 260° C.), and preferably will be preheated to a temperature in the range of about 280° C. to 400° C., more preferably about 370° C. to 400° C. (measured at the outlet of apparatus 62). For 63/37 solder alloy, the preferred fluid preheat temperature is about 370° C. (measured at the outlet of slot 105, 205).

The pulsating or sweeping fluid stream impinging on still molten solder contained on the underside of the circuit board, the interconnections, and the component leads and/or bodies, relocates excess solder on, and/or blasts excess solder from the underside of the board, interconnections, leads, and bodies, and in doing so also minimizes the possibility of solder bridging or icicling or short formation upon solidification.

Referring to FIGS. 1 and 3, in one embodiment of the present invention, the fluid stream, e.g. air is supplied by fluid supply means, generally indicated by 115, through ducting 116 into one or both ends of inner tubular shell 110 which is non-rotatable. The opposite end of inner tubular shell 110, if it is not used for supplying air, is sealed so that the air is only allowed to escape through an open portion or elongate slot 140. The open portion 140 is a rectangular portion which has been cut out of the sidewall of the inner tubular shell 110, the length which is determined by the width of the mass soldering conveyor system and the width of which is determined by the desired maximum angle of impingement for the apparatus. Completely enclosing the inner tubular shell 110 is an outer tubular shell 100 which rotates about the inner shell 110 on bearings means 120 see FIG. 3). The outer tubular shell 100 has longitudinal slots 105a, b, c . . . which run lengthwise perpendicular to the circumference of outer tubular shell 100, the length being substantially equal to the length of open portion 140 and the width being narrow enough to provide a sufficient fluid velocity. The slots 105 are equally spaced apart around the circumference of tubular shell 100 such that only one slot 105, at any given time, is able to be positioned over open portion 140. Seals 103 may be utilized, depending upon the clearance between the inner and outer shells, to ensure that the air, from inner tubular shell 110, is supplied only to the slot 105 positioned over open portion 140. It may be desirable, depending on the total area of open portion 140, to provide an air distribution plate 150 to equalize the fluid flow being emitted out from open portion 140 of the inner tubular shell 110, which teaching is well known in the air distribution art.

The invention works as follows. As outer tubular shell 100 rotates by motor 132 driven drive means, generally indicated as 135, about the open portion 140 of inner tubular shell 110, air is directed through open portion 140, and distribution plate 150, and forced out through the slot 105a of the outer tubing 100 which is positioned over open portion 140. Since outer tubular shell 100, along with slot 105a, are rotating, the air blast forced through slot 105a is also given a rotational sweeping movement until the slot 105a rotates past the trailing edge 130 of open portion 140 and is no longer able to communicate with open portion 140. At that time, a subsequent slot 105b is then positioned over the leading edge 125 of open portion 140 and supplied with air to form a subsequent sweeping air blast. As this second slot 105b rotates over open portion 140, the second air blast is also given a corresponding rotational sweeping movement until it no longer is positioned over any part of open portion 140. This procedure is repeated as each subsequent slot 105c . . . is positioned over the leading edge 125 of open portion 140.

Figure 4:
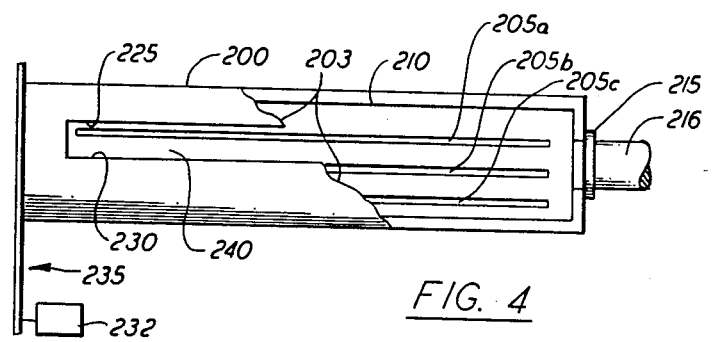
FIG. 4 is a top plan view partly in section of the sweeping air blast portion of the apparatus of FIG. 2.

An alternative embodiment of the present invention is shown in FIGS. 2 and 4. In the embodiment shown in FIGS. 2 and 4, the outer tubular shell 200 is fixed in position, and has an open portion or elongate slot 240 directed toward the underside of the traveling boards 20 while the inner tubular shell 210 is the rotating member which generates the sweeping air blast. As can be seen by comparing the two embodiments as shown, FIGS. 3 and 4, open portion 240 (FIG. 4) is substantially wider than open portion 140 (FIG. 3). Inner tubular shell 210 is rotatably driven by suitable motor 232 driven drive means, generally indicated as 235. The air is supplied by way of fluid supply means 115 through ducting 116 and an air tight rotating joint indicated generally at 245 into one or both end portions of inner rotating shell 210. The outer tubular shell may have seals 203 secured to the inside of outer tubular shell 200 along the perimeter of open portion 240. The inner tubular shell 210 has slots 205a, b, c . . . which run lengthwise, perpendicular to the circumference of the inner tubular shell 210. The slots 205 are spaced apart along its circumference such that only one slot 205 is able to communicate with open portion 240, at any given time. Thus, a sweeping air blast controlled by slot 205 is also obtained by rotating inner tubing 210 in either the clockwise and counter-clockwise direction.

The angle of impingement may be varied over a wide range, preferably between about 30° and about 75°, more preferably about 45° to about 65° by suitable selection of slot sizes. The angle of impingement of the air blast relative to the circuit board should be continuously rapidly varied over the aforesaid range so that each portion of the board is subjected to an air blast over a wide range of angles. Preferably, the complete cycle of angles is repeated every 0.05 to 1.0 seconds, more preferably every 0.1 to 0.15 seconds. Cycle time may readily be controlled by adjusting the rotational speed of the rotating shells.

At least four other possible variations of the above disclosed embodiments are foreseen each of which does not depart from the spirit and scope of the present invention. These embodiments are shown diagramatically in the drawings, FIGS. 5 through 8, and are only briefly described below since their detail description is more fully explained above in relation to the two other embodiments.

Figure 9:
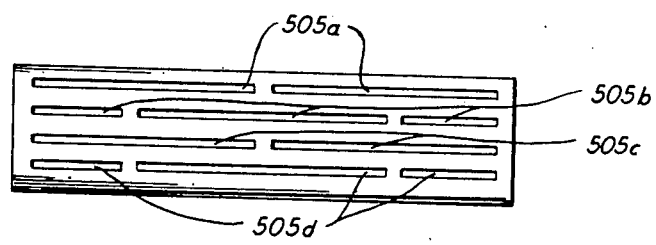
FIG. 9 is a top plan view of the staggered slot arrangement employed in the third embodiment shown in FIG. 5.
Figure 5:
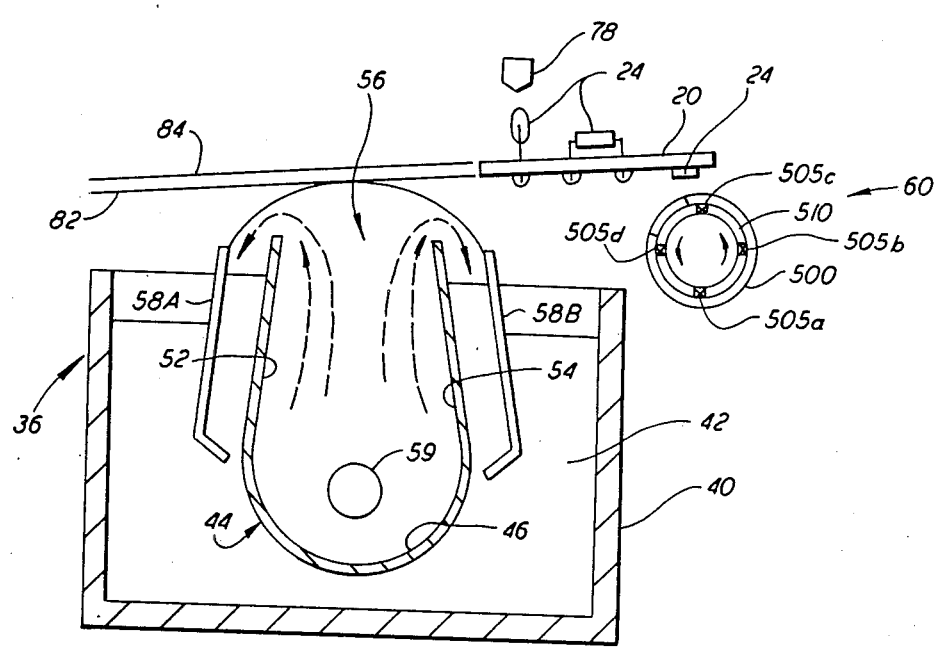
FIG. 5 is a side elevational view partly in section of a third embodiment of a soldering apparatus, made in accordance with the present invention, providing a sweeping air blast of a continuously varying impingement angle to the underside of a circuit board as it leaves the solder wave.

FIG. 5 discloses a third embodiment in which inner tubular shell 510 rotates inside of outer tubular shell 500 similar to the above-disclosed second embodiment. The major variations in this embodiment is that inner tubular shell 510 contains a plurality of staggered longitudinal slots 505 a, b, c, d . . . (as shown in FIG. 9) instead of long, continuous slots.

Figure 6:
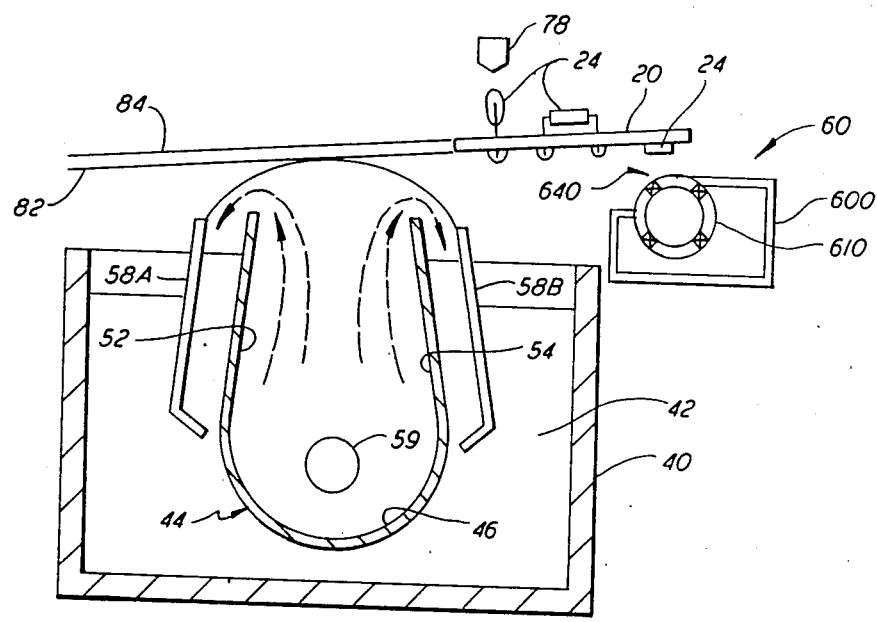
FIG. 6 is a side elevational view partly in section of a fourth embodiment of a soldering apparatus, made in accordance with the invention, providing a sweeping air blast of a continuous varying impingement angle to the underside of a circuit board as it leaves the solder wave.

A variation of the third embodiment is shown in FIG. 6, wherein inner tubular shell 610 rotates inside of a fixed box shell 600, instead of a tubular shell. The box shell 600 is completely sealed except for open portion 640 which controls and defines the output direction of the sweeping air blasts.

Figure 7:
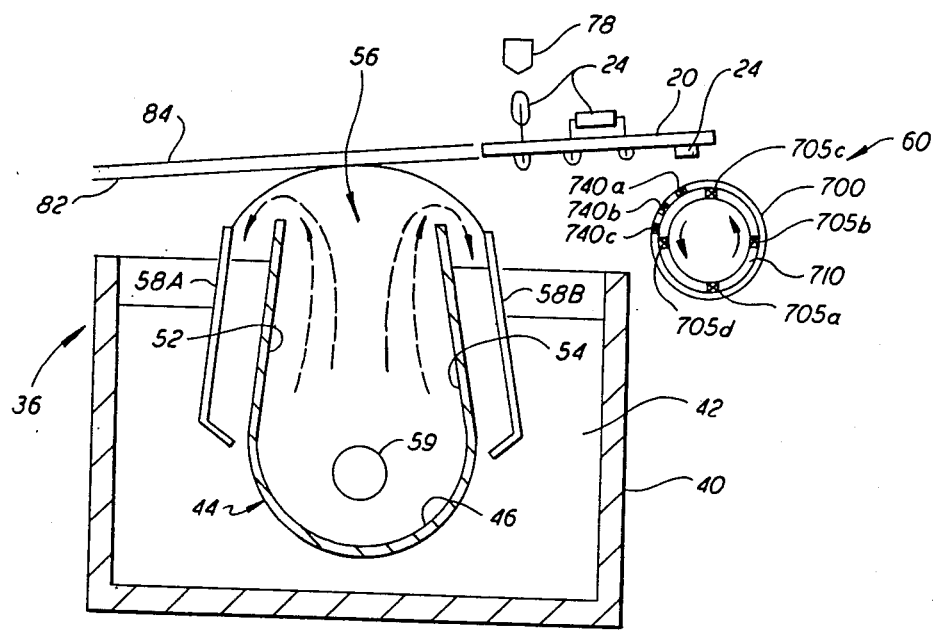
FIG. 7 is a side elevational view partly in section of a fifth embodiment of a wave soldering apparatus, made in accordance with the invention, providing pulsating air blasts at a plurality of different impingement angles to the underside of a circuit board as it leaves the solder wave.

A fifth embodiment is disclosed in FIG. 7 wherein the outer tubular shell 700 contains a plurality of smaller rectangular openings 740a, b, c, . . . , instead of a single large rectangular open portion. The inner tubular shell 710 rotates inside of the outer tubular shell 700 and contains a plurality of longitudinal slots 705a, b, c . . . . The slots 705 are arranged so that only one slot 705 can communicate with the open portion, rectangular open portions 740a, b, c . . . , at any given time. Therefore, a pulsating air blast is generated as the slots 705 communicate sequentially with the open portions 740.

Figure 8:
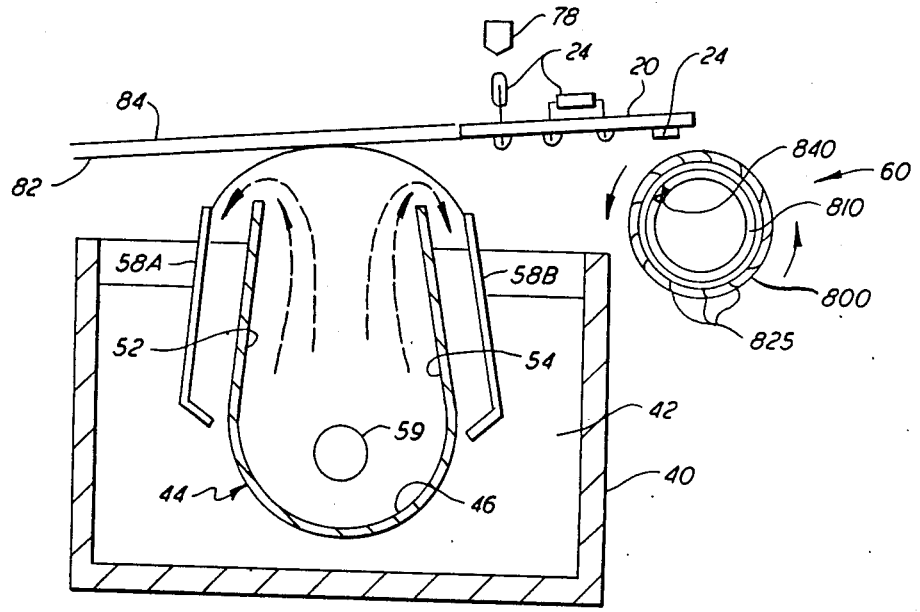
FIG. 8 is a side elevational view partly in section of a sixth embodiment of a wave soldering apparatus, made in accordance with the invention, providing a pulsating air blast of a continuously varying impingement angle to the underside of a circuit board as it leaves the solder wave.

A final embodiment is disclosed in FIG. 8 wherein an outer tubular shell 800, having a plurality of air foils 825 situated longitudinally along the outer tubular shell and comprising the side wall of the tubular shell, rotates about a fixed inner tubular shell 810 having an open portion 840, directed toward the underside of a circuit board 20 to be treated. The air foils 825, as they rotate about the slot 840, either deflect or allow the air to pass straight through, thus resulting in a pulsating air blast to the underside of the circuit board 20.

Still other changes will be obvious to one skilled in the art. Accordingly, it is intended that all matter contained in the above description or shown in the accompanying drawings shall be interpreted in an illustrative and not in a limiting sense.

We claim:

1. An apparatus for mass joining with solder electrical and electronic components assembled on a circuit board wherein said components have leads which protrude therefrom, and comprising in combination: a wave soldering station adapted to provide a wave of molten solder; means for transporting said circuit board across said solder whereby a quantity of molten solder may be deposited onto said circuit board underside and said protruding leads; and an excess solder removal station adjacent said wave soldering station, said excess solder removal station adapted to impinge a sweeping fluid blast of continuously varying angle of impingement directed towards the solder wave onto the bottom surface of the board sufficiently soon after it leaves the solder wave so that the solder is still molten, the sweeping fluid blast having sufficient velocity to remove essentially all bridges and shorts but not sufficient velocity to adversely affect properly wetted joints, whereby each portion of the bottom surface of the board may be subjected to a sweeping fluid blast from a plurality of different angles, said excess solder removal station comprising a first fixedly positioned inner tubular shell having at least one inlet and having an open slot directed toward the point where said boards exit said wave, and a second rotatably mounted outer tubular shell having a plurality of elongate spaced slots formed therein, means for rotating said outer tubular shell and fluid supply means for connection to said inlet, said outer tubular shell encompassing and rotating about said inner tubular shell such that fluid emanating from said inner tubular shell will be directed by the open portion of the inner tubular shell through the slot of the outer shell to form a sweeping fluid blast.

2. An apparatus of claim 1, wherein said fluid blast is swept through an angle between about 30° and 75°.

3. An apparatus of claim 2, wherein said fluid blast is swept through an angle between about 45° and 65°.

4. An apparatus of claim 2, wherein a complete sweep of angles is repeated every 0.05 to 1.0 seconds.

5. An apparatus of claim 4, wherein a complete sweep of angles is repeated every 0.1 to 0.15 seconds.

6. An apparatus of claim 1, wherein said fluid comprises air, and includes means for heating said air to above the temperature of the molten solder prior to directing the air onto said board.

7. An apparatus according to claim 1, wherein said plurality of elongate spaced slots is substantially equally spaced around the circumference of said outer tubular shell, substantially parallel to the axis of said shell.

8. An apparatus for mass joining with solder electrical and electronic components assembled on a circuit board wherein said components have leads which protrude therefrom, and comprising in combination: a wave soldering station adapted to provide a wave of molten solder; means for transporting said circuit board across said solder whereby a quantity of molten solder may be deposited onto said circuit board underside and said protruding leads; and an excess solder removal station adjacent said wave soldering station, said excess solder removal station adapted to impinge a sweeping fluid blast of continuously varying angle of impingement directed towards the solder wave onto the bottom surface of the board sufficiently soon after it leaves the solder wave so that the solder is still molten, the sweeping fluid blast having sufficient velocity to remove essentially all bridges and shorts but not sufficient velocity to adversely affect properly wetted joints, whereby each portion of the bottom surface of the board is subjected to a sweeping fluid blast from a plurality of different angles, said excess solder removal station comprising a first fixedly positioned outer tubular shell, having an open slot directed toward the point where said boards exit said wave, and a second rotatably mounted inner tubular shell having at least one inlet and having a plurality of elongate spaced slots formed therein, means for rotating said inner tubular shell and fluid supply means for connection to said inlet, said inner tubular shell being encompassed by and rotating inside said outer tubular shell such that fluid emanating from said inner tubular shell will be directed by the slot of the inner tubular shell through the open portion of the outer shell to form a sweeping fluid blast.

9. An apparatus of claim 8, wherein said fluid blast is swept through an angle between about 30° and 75°.

10. An apparatus of claim 9, wherein said fluid blast is swept through an angle between about 45° and 65°.

11. An apparatus of claim 9, wherein a complete sweep of angles is repeated every 0.05 to 1.0 seconds.

12. An apparatus of claim 11, wherein a complete sweep of angles is repeated every 0.1 to 0.15 seconds.

13. An apparatus of claim 9, wherein said fluid comprises air, and includes means for heating said air to above the temperature of the molten solder prior to directing the air onto said board.

14. An apparatus according to claim 9, wherein said plurality of elongate spaced slots are substantially equally spaced around the circumference of said inner tubular shell, substantially parallel to the axis of said shell.

* * * * *